(12) United States Patent
Hsu et al.

(10) Patent No.: US 12,347,919 B2
(45) Date of Patent: Jul. 1, 2025

(54) SEMICONDUCTOR PACKAGE ANTENNA STRUCTURE AND ITS MANUFACTURING METHOD

(71) Applicant: Phoenix Pioneer Technology Co., Ltd., Hsinchu County (TW)

(72) Inventors: Che-Wei Hsu, Hsinchu County (TW); Shih-Ping Hsu, Hsinchu County (TW)

(73) Assignee: Phoenix Pioneer Technology Co., Ltd., Hsinchu County (TW)

( * ) Notice: Subject to any disclaimer, the term of this patent is extended or adjusted under 35 U.S.C. 154(b) by 116 days.

(21) Appl. No.: 18/519,181

(22) Filed: Nov. 27, 2023

(65) Prior Publication Data

US 2024/0195047 A1 Jun. 13, 2024

(30) Foreign Application Priority Data

Dec. 9, 2022 (TW) .................................. 111147370

(51) Int. Cl.
*H01Q 1/22* (2006.01)
*H01L 21/48* (2006.01)
*H01L 21/56* (2006.01)
*H01L 23/00* (2006.01)
*H01L 23/31* (2006.01)
*H01L 23/498* (2006.01)
*H01Q 1/38* (2006.01)

(52) U.S. Cl.
CPC ....... *H01Q 1/2283* (2013.01); *H01L 21/4857* (2013.01); *H01L 21/568* (2013.01); *H01L 23/3107* (2013.01); *H01L 23/49822* (2013.01); *H01L 24/24* (2013.01); *H01L 24/82* (2013.01); *H01Q 1/38* (2013.01); *H01L 2224/24226* (2013.01); *H01L 2224/82005* (2013.01)

(58) Field of Classification Search
CPC .... H01Q 1/2283; H01Q 1/38; H01L 21/4857; H01L 21/568; H01L 23/3107; H01L 23/49822; H01L 24/24; H01L 24/82; H01L 2224/24226; H01L 2224/82005; H01L 23/5389; H01L 24/19; H01L 24/20
See application file for complete search history.

(56) References Cited

U.S. PATENT DOCUMENTS

2019/0355680 A1* 11/2019 Chuang ............... H01L 23/5385
2020/0058606 A1*  2/2020 Tsai ...................... H01L 23/481

* cited by examiner

*Primary Examiner* — David E Lotter

(57) ABSTRACT

The invention discloses a semiconductor package antenna structure and its manufacturing method, wherein the semiconductor package antenna structure includes a first substrate, a semiconductor chip, and a second substrate. The first substrate has at least two stacked first redistribution layers, and each of the first redistribution layers has a first dielectric layer, a first patterned metal layer, and/or a first conductive pillar layer. The semiconductor chip is embedded in the first substrate and coupled to the first redistribution layers. The second substrate has a second redistribution layer, a second conductive pillar layer, and an air dielectric layer, wherein the second conductive pillar layer is protruded from the second redistribution layer. The second substrate is connected to the first substrate by a second conductive pillar layer, and the air dielectric layer is located between the second redistribution layer, the second conductive pillar layer, and the first substrate.

11 Claims, 11 Drawing Sheets

SEMICONDUCTOR PACKAGE ANTENNA STRUCTURE AND ITS MANUFACTURING METHOD

CROSS REFERENCE TO RELATED APPLICATIONS

This Non-provisional application claims priority under 35 U.S.C. § 119(a) on Patent Application No. 111147370 filed in Republic of China on Dec. 9, 2022, the entire contents of which are hereby incorporated by reference.

BACKGROUND

1. Technical Field

The invention relates to a package component and a manufacturing method thereof, and in particular to a semiconductor package antenna structure and a manufacturing method thereof.

2. Description of Related Art

The use of millimeter-wave (mmWave) technology in the fifth-generation mobile communication (5G) has already begun to enter the consumer market. Antennas, as essential components of wireless communication systems, have gained significant attention in recent times, particularly in the context of their integration with the transceiver systems formed by the chips, with a particular focus on Antenna-in-Package (AiP) technology.

Please refer to FIG. 1, which illustrates a first-conventional packaged antenna 10. The packaged antenna 10 comprises a substrate 11, a first antenna structure 12, a second antenna structure 13, and a chip 14. The substrate 11 has a first surface 111 and a second surface 112, with a plurality of dielectric layers 113 and a plurality of circuit layers 114 disposed between the first surface 111 and the second surface 112. The first antenna structure 12 is disposed on the first surface 111 of the substrate 11 and includes a dielectric layer 121, a conductive blind 122, and a first antenna metal layer 123. The conductive blind 122 and the first antenna metal layer 123 are electrically connected to a part of the circuit layer 114 exposed on the first surface 111.

The second antenna structure 13 is disposed on top of the first antenna structure 12 and includes a dielectric layer 131 and a second antenna metal layer 132 disposed on a surface 1311 of the dielectric layer 131. The chip 14 is flip-chip bonded to the second surface 112 of the substrate 11 and electrically connected to a part of the circuit layer 114 exposed on the second surface 112. Additionally, a plurality of solder balls 15 are also disposed on the second surface 112 of the substrate 11 and electrically connected to another part of the circuit layer 114 exposed on the second surface 112.

The substrate 11 of the packaged antenna 10 and the antenna structure together form an integral flip-chip packaging substrate structure. The substrate structure is not symmetric in thickness above and below the core layer, especially where the dielectric layer of the antenna structure is significantly thicker than any of the circuit structures at the ends of the substrate.

Moreover, the chip 14 of the packaged antenna 10 is flip-chip bonded to the second surface 112 of the substrate 11, meaning the chip 14 is exposed. This exposure of the chip also necessitates that the solder balls have sufficient height to create the space required for accommodating the chip, making it challenging to reduce the overall package height.

Please refer to FIG. 2, which shows a second-conventional packaged antenna 90. The packaged antenna 90 includes a substrate 91, a chip 92, a supporting pillar 93, and an upper substrate 94. The chip 92 and the supporting pillar 93 are respectively disposed on the substrate 91. The upper substrate 94 is disposed on the supporting pillar 93, creating an air gap 95 between the upper substrate 94 and the substrate 91. Additionally, an antenna layer 911 is formed on the surface of the substrate 91, electrically connected to the chip 92. Furthermore, a frequency-selective surface structure 941 is formed on the surface of the upper substrate 94, placed above the antenna layer 911.

Although the second-conventional packaged antenna 90 replaces the dielectric of the antenna with the air gap 95, which can reduce the dielectric constant and thus improve antenna performance, the placement of the chip 92 within the air gap 95 leads to issues of signal interference during chip 92 operation, which, in turn, affects antenna performance.

Following the above, in the fifth-generation mobile communication and future communication technologies, the packaging of the antenna and the chip is integrated in order to solve the above problems and make it have better antenna performance or smaller packaging volume, such as reducing the thickness, is one of the current important subject matters.

SUMMARY OF THE INVENTION

In view of the foregoing, an objective of the present invention is to provide a semiconductor package antenna structure and its manufacturing method, which can address the electrical problems caused by the conventional asymmetric warping of antenna packaging. This results in improved radiation performance of the semiconductor package antenna structure within the same volume.

Another objective of the present invention is to provide a semiconductor package antenna structure and its manufacturing method that allows the semiconductor package antenna structure to have a smaller packaging volume while maintaining the same antenna radiation performance.

To achieve the above, the present invention provides a semiconductor package antenna structure, which includes a first substrate, a chip, and a second substrate. The first substrate includes at least two stacked first redistribution layers, and each of the first redistribution layers includes a first dielectric layer, a first patterned metal layer, and/or a first conductive pillar layer. The chip is embedded within the first substrate and is coupled to the first redistribution layers. The second substrate is disposed opposite to the first substrate and has a second redistribution layer, a second conductive pillar layer, and an air dielectric layer. The second conductive pillar layer is protruded on the second redistribution layer. The second substrate is connected to the first substrate through the second conductive pillar layer, and the air dielectric layer is situated between the second redistribution layer, the second conductive pillar layer, and the first substrate.

In one embodiment, the first redistribution layer of the first substrate has a metal chip holder, which is in contact with the chip and is located between the chip and the second substrate.

In one embodiment, a part of the first redistribution layer, a part of the second redistribution layer, and a part of the second conductive pillar layer form a transmitting antenna, while another part of the first redistribution layer, another part of the second redistribution layer, and another part of the second conductive pillar layer form a receiving antenna.

In one embodiment, a part of the first conductive pillar layer and a part of the second conductive pillar layer are used to adjust the radiation field pattern of the antenna. The appropriate height is adjusted depending on the bandwidth of the application, just like forming an antenna cavity.

In one embodiment, the second conductive pillar layer is a fence-like type or a continuous wall type.

In addition, to achieve the above, the present invention also provides a manufacturing method for the semiconductor package antenna structure, which includes forming a first substrate and a second substrate and bonding the first substrate and the second substrate. The step of forming the first substrate includes sequentially forming at least two layers of stacked first redistribution layers. During the process of forming at least two layers of the stacked first redistribution layers, a chip is embedded within these layers. An active surface of the chip faces away from the second substrate, and it is electrically coupled with one of the first redistribution layers. The step of forming the second substrate includes forming a second redistribution layer and forming a second conductive pillar layer protruding from the second redistribution layer. The bonding between the first substrate and the second substrate involves using the second conductive pillar layer to connect the two substrates. An air dielectric layer is formed between the second redistribution layer, the second conductive pillar layer, and the first substrate.

In one embodiment, the step of forming at least two layers of stacked first redistribution layers for the first substrate includes further steps. These steps include forming a second seed layer, forming a photoresist layer with at least one second through hole on the second seed layer, electroplating to form a first patterned metal layer and/or a first conductive pillar layer within the second through hole, placing the chip on the first patterned metal layer with its active surface coupled with another first redistribution layer, removing the photoresist layer and second seed layer, and forming a first dielectric layer to cover the first patterned metal layer and/or the first conductive pillar layer and the chip.

In one embodiment, before forming the first dielectric layer, the method further includes connecting the chip to the first patterned metal layer, and the first dielectric layer also covers the chip.

In one embodiment, the second conductive pillar layer of the second substrate is connected to the first patterned metal layer or the first conductive pillar layer of the first substrate through the solder-ball, the conductive bump, or conductive adhesive.

Furthermore, to achieve the above, the present invention also provides another method for manufacturing the semiconductor package antenna structure. This method includes forming a first substrate and forming a second substrate on the first substrate. The step of forming the first substrate includes sequentially forming at least two stacked layers of the first redistribution layer. During the formation of the at least two stacked layers of the first redistribution layer, a chip is embedded within the at least two stacked layers of the first redistribution layer. An active surface of the chip faces away from the second substrate, and the active surface of the chip is coupled with one of the first redistribution layers. The step of forming the second substrate includes forming a first seed layer on the first substrate, forming a patterned photoresist layer with at least one first through hole in it on the first seed layer, electroplating to form a second conductive pillar layer in the first through hole, forming a second redistribution layer connected to the second conductive pillar layer, and removing the patterned photoresist layer to form an air dielectric layer between the second redistribution layer, the second conductive pillar layer, and the first substrate.

As mentioned above, the semiconductor package antenna structure and its manufacturing method disclosed in the present invention utilize the air dielectric layer as the dielectric material for antenna radiation in the semiconductor package antenna structure. Since the dielectric constant of air approaches '1,' it can effectively increase the antenna bandwidth or reduce the package volume. Additionally, the chip in the semiconductor package antenna structure is embedded within the package, allowing electrical connections of the chips to be made directly with copper as the electrical interconnect through semiconductor processes, eliminating the need for additional conductive bumps or solder balls. This further reduces the package thickness and simplifies the manufacturing process.

The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

The parts in the drawings are not necessarily drawn to scale, the emphasis instead being placed upon clearly illustrating the principles of at least one embodiment. In the drawings, like reference numerals designate corresponding parts throughout the various diagrams, and all the diagrams are schematic.

DETAILED DESCRIPTION

In order to enable those with ordinary knowledge in the technical field to understand the contents of the present invention and implement the contents of the present invention, appropriate embodiments and drawings are described as follows.

Figure 1:
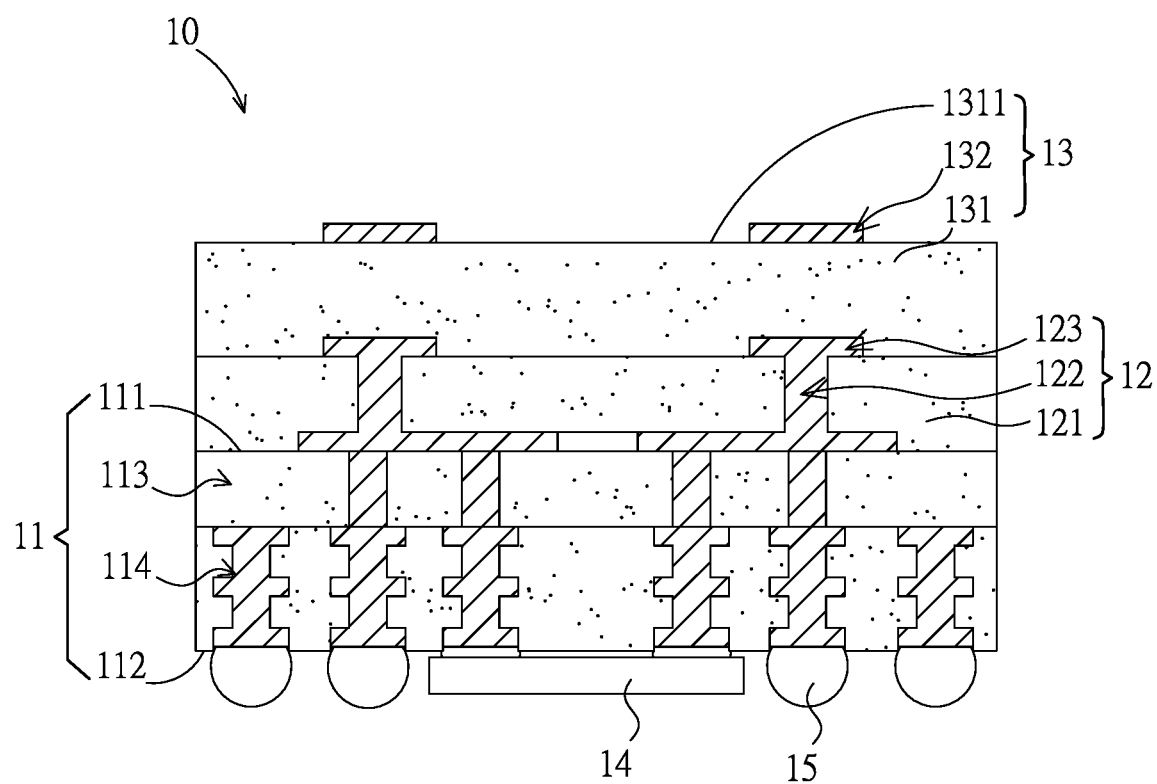
FIG. 1 is a schematic structural diagram showing the first conventional packaged antenna.
Figure 2:
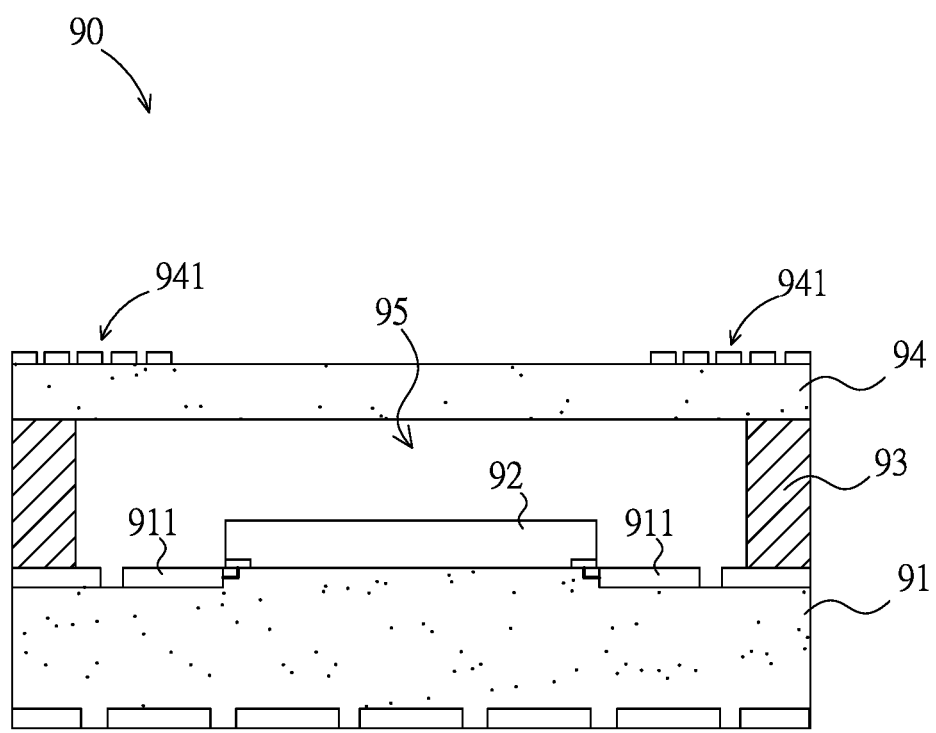
FIG. 2 is a schematic structural diagram showing the second conventional packaged antenna.
Figure 3:
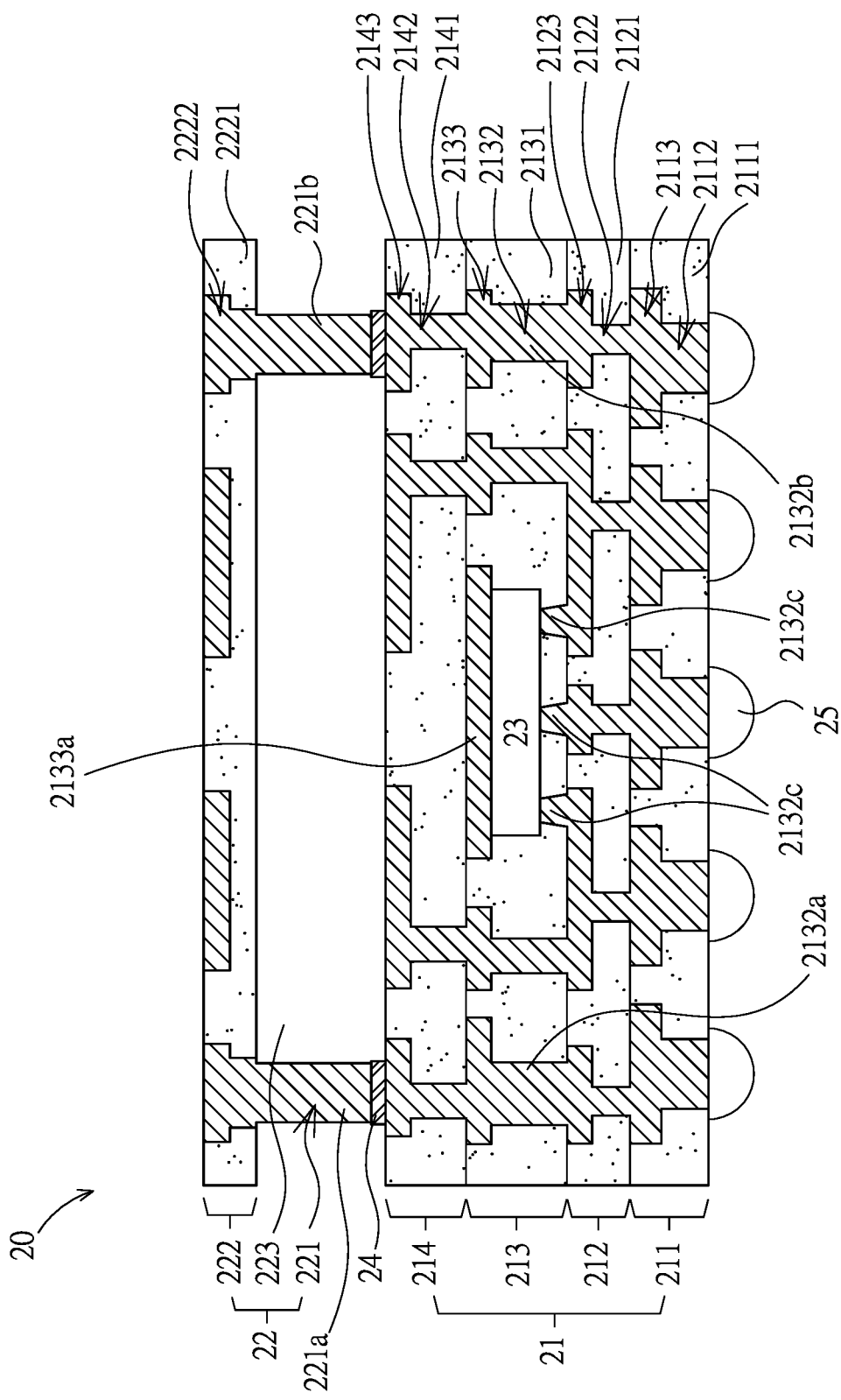
FIG. 3 is a schematic structural diagram showing the semiconductor package antenna structure according to the first embodiment of the present invention.

FIG. 3 illustrates a cross sectional schematic diagram of the semiconductor package antenna structure 20, which is the first embodiment of the present invention. As shown in FIG. 3, the semiconductor package antenna structure 20 includes a first substrate 21, a second substrate 22, and a semiconductor chip 23. The semiconductor package antenna structure 20 is designed as an antenna in package (AiP), where the antenna can be a flat antenna, microstrip antenna, phased-array antenna, dipole antenna, or slot antenna.

In this embodiment, the first substrate 21 has multiple layers of redistribution layers, such as the four layers of the first redistribution layer 211, 212, 213, and 214. The first redistribution layer 211 includes a first dielectric layer 2111, a first conductive pillar layer 2112, and a first patterned metal layer 2113. The first redistribution layer 212 is disposed on the first redistribution layer 211 and includes a first dielectric layer 2121, a first conductive pillar layer 2122, and a first patterned metal layer 2123, with the first conductive pillar layer 2122 electrically connected to the first patterned metal layer 2113. The first redistribution layer 213 includes a first dielectric layer 2131, a first conductive pillar layer 2132, and a first patterned metal layer 2133, with the first conductive pillar layer 2132 electrically connected to the first patterned metal layer 2123. The first redistribution layer 214 includes a first dielectric layer 2141, a first conductive pillar layer 2142, and a first patterned metal layer 2143, with the first conductive pillar layer 2142 electrically connected to the first patterned metal layer 2133. This embodiment uses four layers of the first redistribution layer for illustration. In other embodiments, more or fewer first redistribution layers can be designed based on actual functional requirements.

The semiconductor chip 23, for example, can be an RF chip capable of processing functions such as receiving and transmitting antenna radiation or electromagnetic signals. In this embodiment, the semiconductor chip 23 is embedded within the first dielectric layer 2131 of the first redistribution layer 213. One side of the semiconductor chip 23 is disposed of near or adjacent to the first patterned metal layer 2133 with a metal chip holder 2133a. The placement can be for conducting or non-conducting purposes. The metal chip holder 2133a can serve as a grounding element to provide electromagnetic interference (EMI) protection. One side of the semiconductor chip 23 is disposed on the conductive contact 2132c of the first conductive pillar layer 2132, facilitating signal conduction for the semiconductor chip 23. In other embodiments, the semiconductor chip 23 can be embedded within any of the first redistribution layers of the first substrate 21, without limiting its location.

The second substrate 22 is disposed on top of the first substrate 21 and is electrically connected to the first patterned metal layer 2133 of the first substrate 21. The second substrate 22 includes a second conductive pillar layer 221, a second redistribution layer 222, and an air dielectric layer 223. One end of the second conductive pillar layer 221 is electrically connected to the first patterned metal layer 2143 of the first redistribution layer 214 through a conductive element 24, and the other end is electrically connected to the second redistribution layer 222. The second redistribution layer 222 includes a second dielectric layer 2221 and a second patterned metal layer 2222. The second patterned metal layer 2222 is electrically connected to the second conductive pillar layer 221. The air dielectric layer 223 is situated between the second redistribution layer 222, the second conductive pillar layer 221, and the first substrate 21.

It should be noted that the mentioned first redistribution layer 214 may be a first antenna circuit, and the second redistribution layer 222 may be a second antenna circuit. Additionally, the first redistribution layers 211, 212, 213 of the first substrate 21, along with the semiconductor chip 23, may collectively form a packing substrate with the embedded chip. Furthermore, the active surface of the semiconductor chip 23 is faced away from the second substrate 22.

Figure 9:
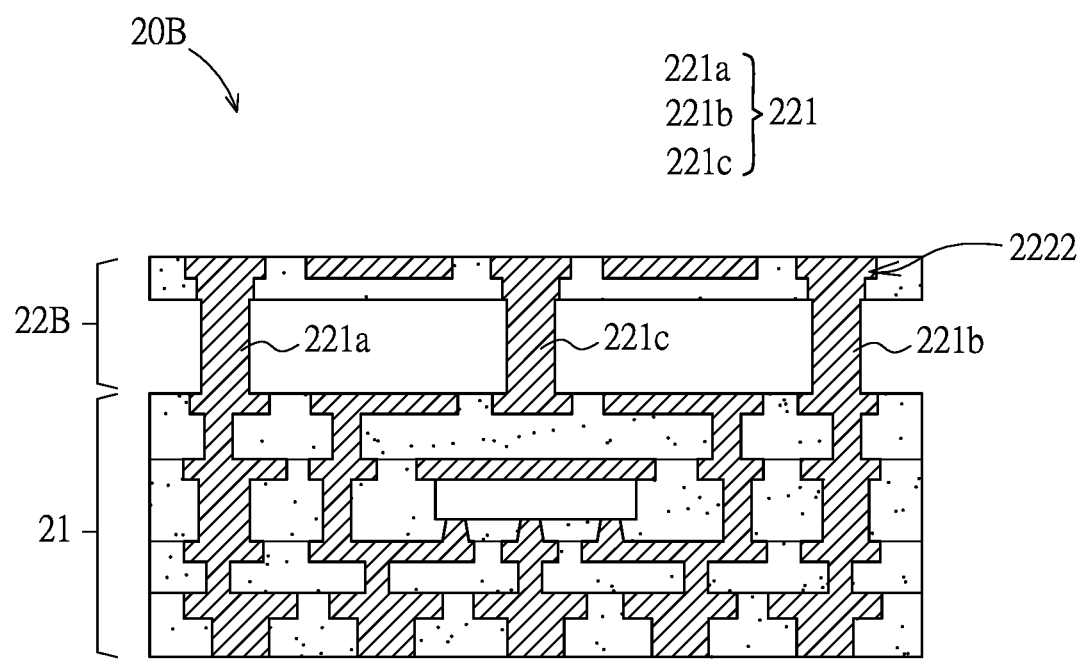
FIG. 9 is a schematic structural diagram showing the semiconductor package antenna structure according to the third embodiment of the present invention.

It should be noted that the conductive pillars in the second conductive pillar layer 221 may be arranged in either a spaced or continuous wall configuration. In the spaced arrangement, the conductive pillars are set up like a fence, while in a continuous wall arrangement, the conductive pillars form architecture similar to a barrier. When the second conductive pillar layer 221 is in a continuous wall configuration, it means that the air dielectric layer 223 is situated in a partially enclosed or fully enclosed space. Additionally, the conductive pillars in the second conductive pillar layer 221 may also be referred to as supporting pillars, as shown in FIG. 9 that serve to provide structural stability to the semiconductor package antenna structure 20 and ensure mechanical strength.

The semiconductor package antenna structure 20 is used as an antenna package, in which the first redistribution layers 211, 212, 213, 214 and the second redistribution layer 222 constitute one of the transceiver structures of the antenna.

Furthermore, a part of the conductive pillars in the first conductive pillar layer and some in the second conductive pillar layer within the semiconductor package antenna structure 20 may serve as adjustments for antenna radiation patterns. In this embodiment, the conductive pillars 2132a, 2132b in the first conductive pillar layer 2132 and the conductive pillars 221a, 221b in the second conductive pillar layer 221 may be utilized for adjusting antenna radiation patterns.

Next, please refer to FIGS. 4A to 4C, 5A to 5D, and 6A to 6F to illustrate the first method for manufacturing the semiconductor package antenna structure 20 according to the first embodiment of the invention. It is important to note that in this embodiment, the first substrate 21 and the second substrate 22 are separately produced before being combined. To facilitate the explanation, this embodiment starts with the fabrication of the second substrate 22, although this is not intended to dictate the order of manufacturing. The manufacturing method for the second substrate 22 includes steps S01 to S03, as detailed in the FIGS. 4A to 4C.

Figure 4A:
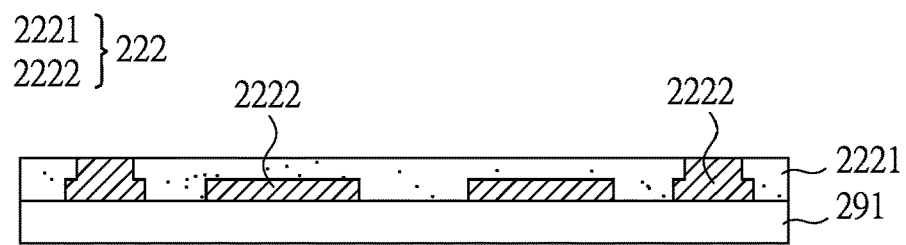
FIGS. 4A to 4C are schematic diagrams showing the manufacturing process of the second substrate in the first manufacturing method corresponding to the semiconductor package antenna structure in the first embodiment.
Figure 4B:
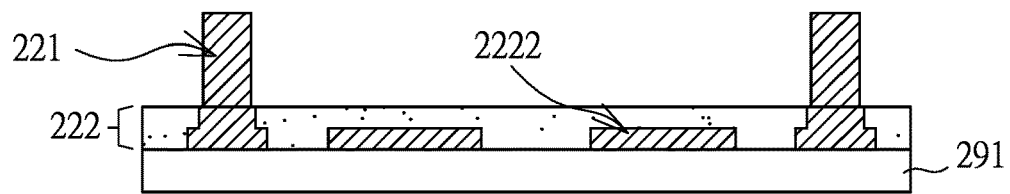

As shown in FIG. 4A, step S01 is to provide a temporary carrying board 291 and form the second redistribution layer 222 on the temporary carrying board 291. In this embodiment, the temporary carrying board 291 is a large-area carrier board with the panel level, which means it has a larger area compared to wafers and is typically square (although not limited to a square shape) to significantly improve area utilization and production capacity. Please refer to FIGS. 5A to 5D for an explanation of the method for fabricating the second redistribution layer 222 on the temporary carrying board 291.

Figure 5A:
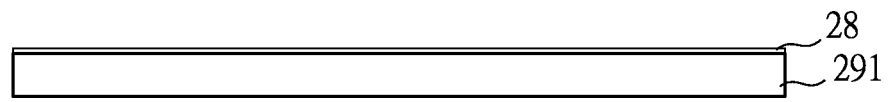
FIGS. 5A to 5D are schematic diagrams showing the manufacturing process of forming the second redistribution layer.
Figure 5B:
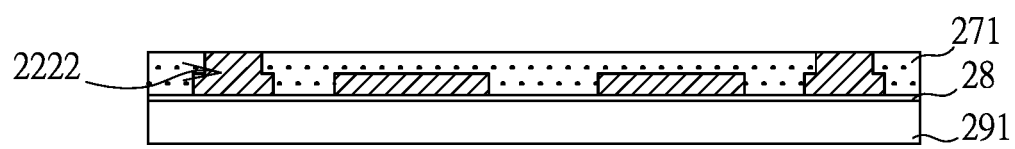
Figure 5C:
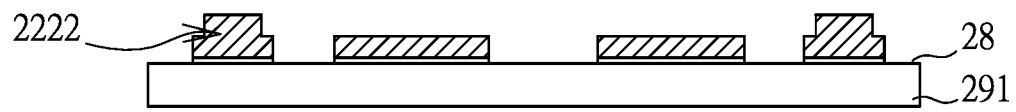
Figure 5D:
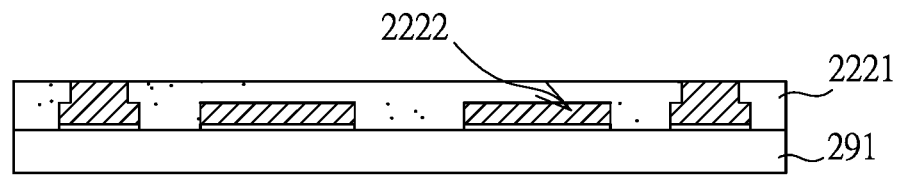

As illustrated in FIGS. 5A to 5D, the method of the invention is to use the patterned circuit build-up technology of the IC packaging carrier board. In FIG. 5A, a seed layer 28 is formed on one surface of the temporary carrying board 291. Then, as shown in FIG. 5B, a photoresist layer 271 is formed on the seed layer 28, and a photolithographic process is used to create a plurality of openings in the photoresist layer 271. The openings are then electroplated with the necessary patterned metal layers. This process is repeated to create a two-layer stack of the second patterned metal layer 2222. Subsequently, as illustrated in FIG. 5C, the photoresist layer 271 is removed, and then the seed layer 28 exposed outside of the second patterned metal layer 2222 is etched away. Finally, as shown in FIG. 5D, the second dielectric layer 2221 is formed on the temporary carrying board 291 and covers the second patterned metal layer 2222. Additionally, the surface of the second dielectric layer 2221 may be polished to expose a part of the second patterned metal layer 2222.

In addition to the photolithographic process, it should be noted that the openings described in the previous explanation may also be created using laser drilling. The seed layer 28, which has a thinner thickness, is only detailed in FIGS. 5A to 5D and is omitted in other figures. Furthermore, since the manufacturing process of the redistribution layers (including the conductive pillar layer) is similar, detailed descriptions of the other redistribution layers are not repeated.

Regarding the dielectric layer, it can be made from either photosensitive or non-photosensitive dielectric materials. Examples include but are not limited to EMC, ABF, BT, FR5, PI, LCP, etc. Furthermore, at the antenna end, the material of the dielectric layer is a low dielectric constant and low dielectric loss material, such as film-like dielectric sealing materials like molding compound EMC, ABF, BT, or glass, without limitation.

Next, please refer back to FIG. 4B. In step S02, the second conductive pillar layer 221 is formed on the second redistribution layer 222 so that the second conductive pillar layer 221 protrudes from the second redistribution layer 222 to create a raised structure. To elaborate, the second conductive pillar layer 221 is formed on the exposed end face of the second patterned metal layer 2222, which is exposed by the second dielectric layer 2221.

It should be noted that in other embodiments, the conductive pillars of the second conductive pillar layer 221 may also be pre-molded and then electrically connected to the end face of the second patterned metal layer 2222 using a conductive bonding means, such as conductive adhesive (not shown in the figures).

Figure 4C:
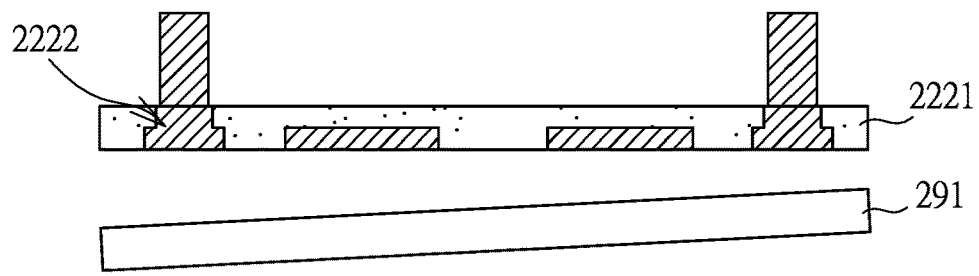

Next, please refer to FIG. 4C. Step S03 is to remove the temporary carrying board 291. The temporary carrying board 291 may be removed through a peeling process, although this is not limited to this specific method. After removing the temporary carrying board 291, a grinding process may be used to make the second dielectric layer 2221 substantially coplanar with the surface of a part of the second patterned metal layer 2222.

Figure 4D:
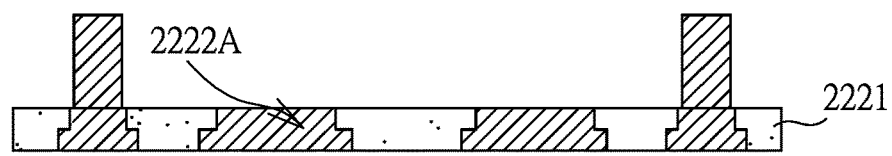
FIG. 4D is a schematic diagram showing another second substrate with a different second patterned metal layer in the first embodiment.

It is worth noting that, depending on the openings formed on the photoresist layer 271, different variations of the second patterned metal layer 2222A may be formed, as shown in FIG. 4D.

Next, please refer to FIGS. 6A to 6F. The method for producing the first substrate 21 includes steps S11 to S16.

Figure 6A:
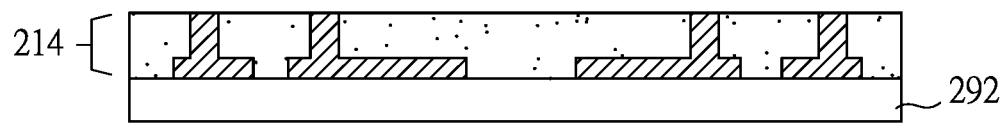
FIGS. 6A to 6F are schematic diagrams showing the manufacturing process of the first substrate in the first manufacturing method corresponding to the semiconductor package antenna structure in the first embodiment.

Please refer to FIG. 6A. Step S11 is to provide a temporary carrying board 292 and form the first redistribution layer 214 on the temporary carrying board 292. The detailed steps for forming the first redistribution layer 214 are similar to the fabrication process for the second redistribution layer 222, so they are not repeated here.

Figure 6B:
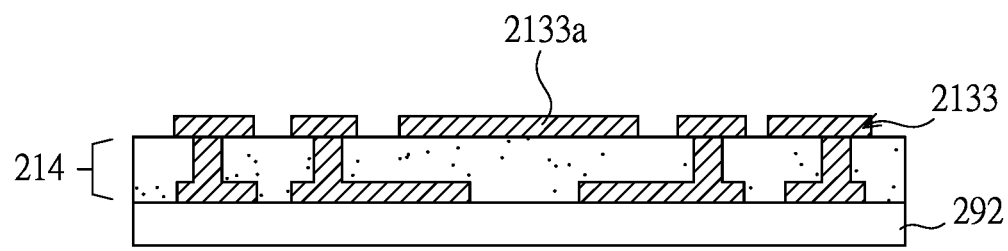

Please refer to FIG. 6B. Step S12 is to form a part of the first redistribution layer 213 on top of the first redistribution layer 214. In detail, the first patterned metal layer 2133 is formed, which includes the metal chip holder 2133a.

Figure 6C:
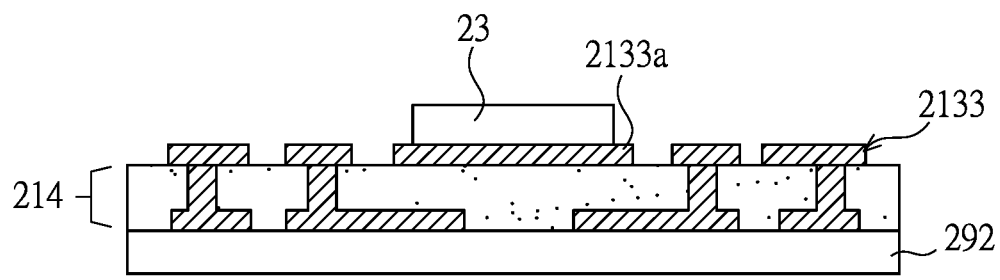

Please refer to FIG. 6C. Step S13 is to dispose the semiconductor chip 23 on the metal chip holder 2133a. In this embodiment, the semiconductor chip 23 is attached to the metal chip holder 2133a using an adhesive. In other embodiments, if the semiconductor chip 23 needs to be electrically connected to the metal chip holder 2133a, this may be achieved through the use of conductive bumps or conductive adhesive.

Figure 6D:
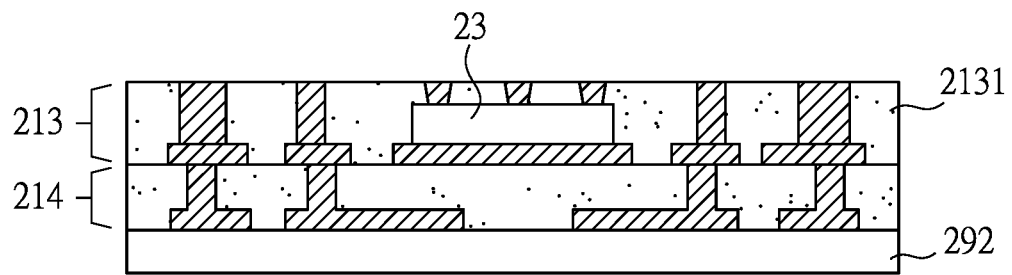

Please refer to FIG. 6D. Step S14 continues to form another part of the first redistribution layer 213 to embed the semiconductor chip 23 within the first dielectric layer 2131.

Figure 6E:
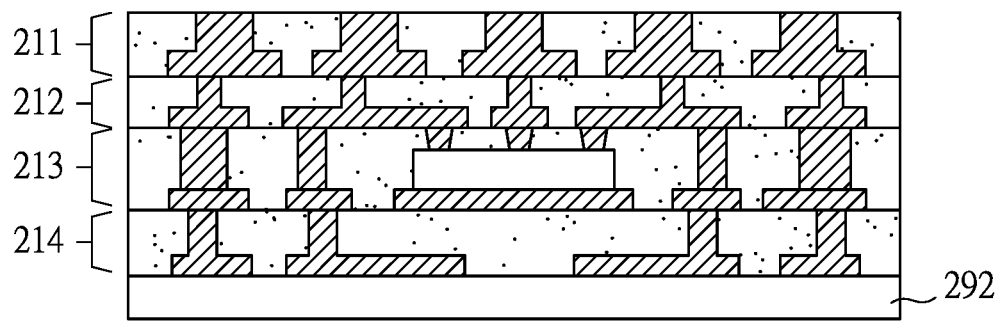

Please refer to FIG. 6E. Step S15 is to form the first redistribution layer 212 on top of the first redistribution layer 213. Step S16 is to form the first redistribution layer 211 on top of the first redistribution layer 212.

Figure 6F:
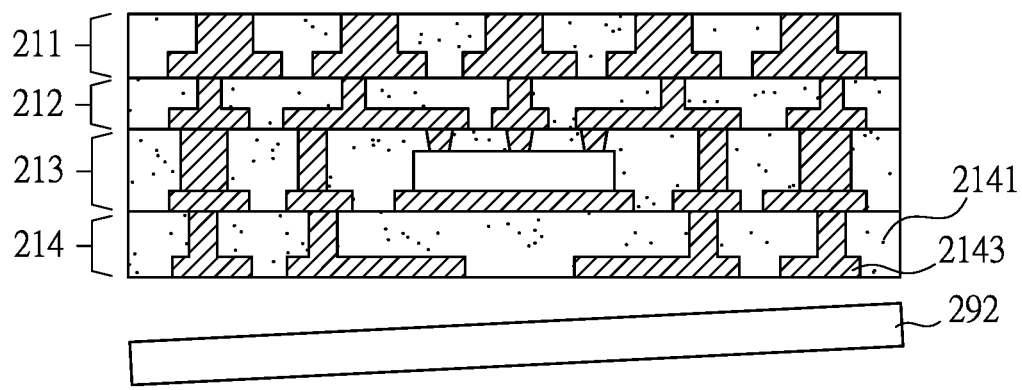

Please refer to FIG. 6F. Step S17 is to remove the temporary carrying board 292. The temporary carrying board 292 may be removed using a peeling or etching process, and this is not limited. After the temporary carrying board 292 is removed, a grinding process can be applied to make the first dielectric layer 2141 and a part of the first patterned metal layer 2143 essentially coplanar.

Finally, step S18 is to join the first substrate 21 and the second substrate 22 using the conductive element 24 to form the semiconductor package antenna structure 20 as shown in FIG. 3. The conductive element 24 may be chosen from options like the solder ball, conductive bump, or conductive adhesive. This allows the connection of the second conductive pillar layer 221 of the second substrate 22 to the first patterned metal layer 2143 of the first substrate 21 through solder balls, conductive bumps, or conductive adhesive. Additionally, if needed, conductive bumps 25 or solder balls may optionally be placed on the end face of the first conductive pillar layer 2112 exposed to the first dielectric layer 2111. It is worth mentioning that because the semiconductor chip 23 is embedded within the first redistribution layer, the conductive bumps 25 or solder balls do not need to consider the thickness of the semiconductor chip 23, which helps keep the volume compact. Therefore, the spacing between the conductive pillars of the first conductive pillar layer 2112 may be minimized according to the manufacturing process to meet the requirements for fine pitch input/output (I/O) points.

Next, please refer to FIGS. 7A to 7D to explain the second manufacturing method for the semiconductor package antenna structure 20 according to the first embodiment of the invention. It is important to note that the manufacturing process for the first substrate 21 is the same as previously described in FIGS. 6A to 6F, therefore, the manufacturing method of the first substrate 21 will not be described in detail. The difference lies in the subsequent manufacturing process for the second substrate 22. It is also essential to understand that the manufacturing order of the first substrate 21 and the second substrate 22 needs to be coordinated.

Figure 7A:
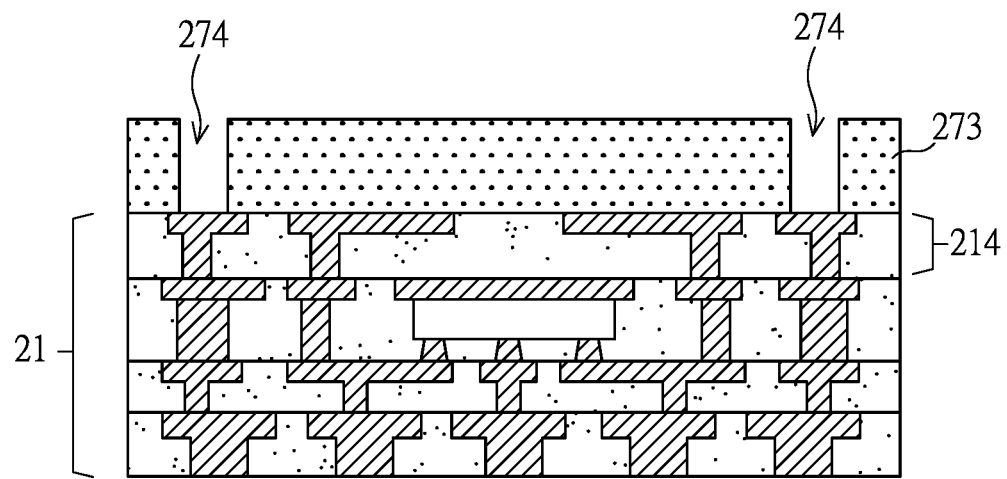
FIGS. 7A to 7D are schematic diagrams showing the manufacturing process of the second manufacturing method corresponding to the semiconductor package antenna structure in the first embodiment.

Please refer to FIG. 7A, step S21 is to form the photoresist layer 273 on the first redistribution layer 214 of the first substrate 21. Step S22 is to form a plurality of openings 274 on the photoresist layer 273 through the exposure and development photolithography process.

Figure 7B:
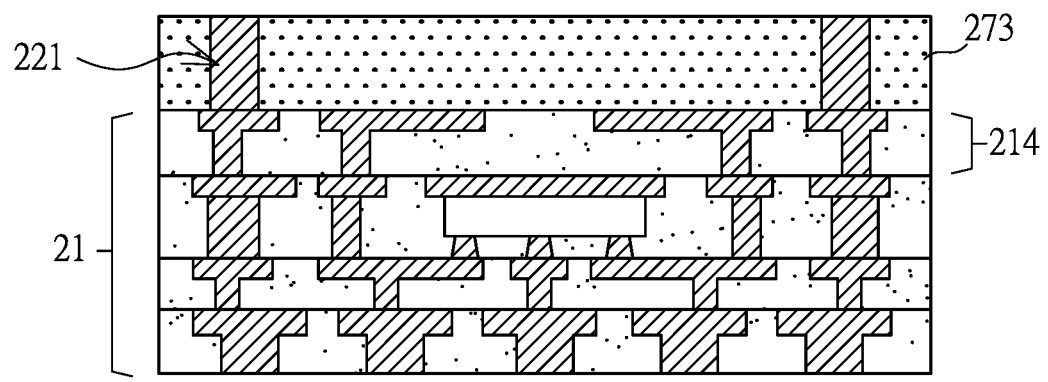

Please refer to FIG. 7B, step S23 is to electroplate a metal layer within the openings 274 to form the second conductive pillar layer 221.

Figure 7C:
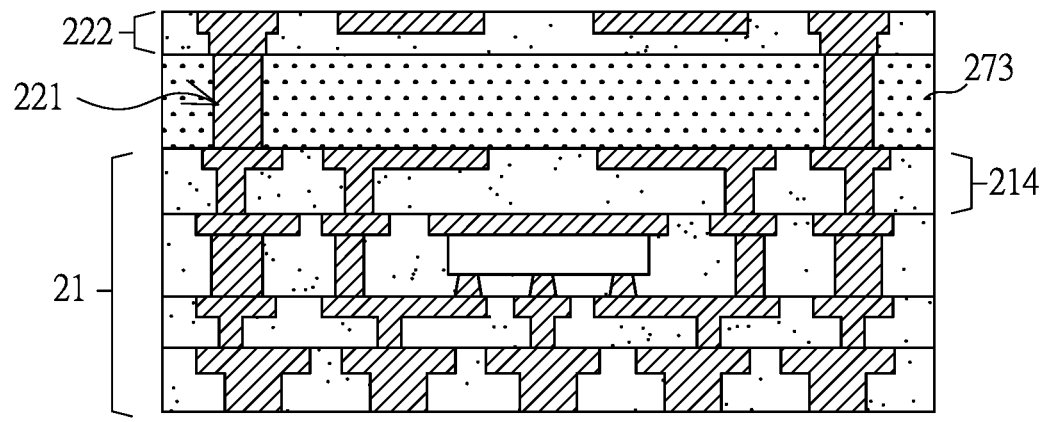

Please refer to FIG. 7C, step S24 is to form the second redistribution layer 222 on top of the photoresist layer 273. The manufacturing process for the second redistribution layer 222 is similar to that of the previously described redistribution layers and will not be elaborated on here.

Figure 7D:
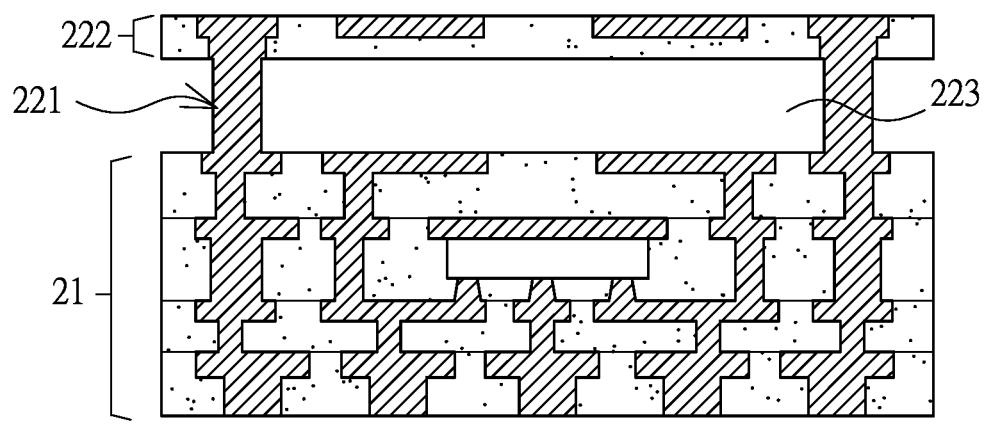

Please refer to FIG. 7D, step S25 is to remove the photoresist layer 273 to form the air dielectric layer 223 between the second redistribution layer 222, the second conductive pillar layer 221, and the first substrate 21.

Figure 8:
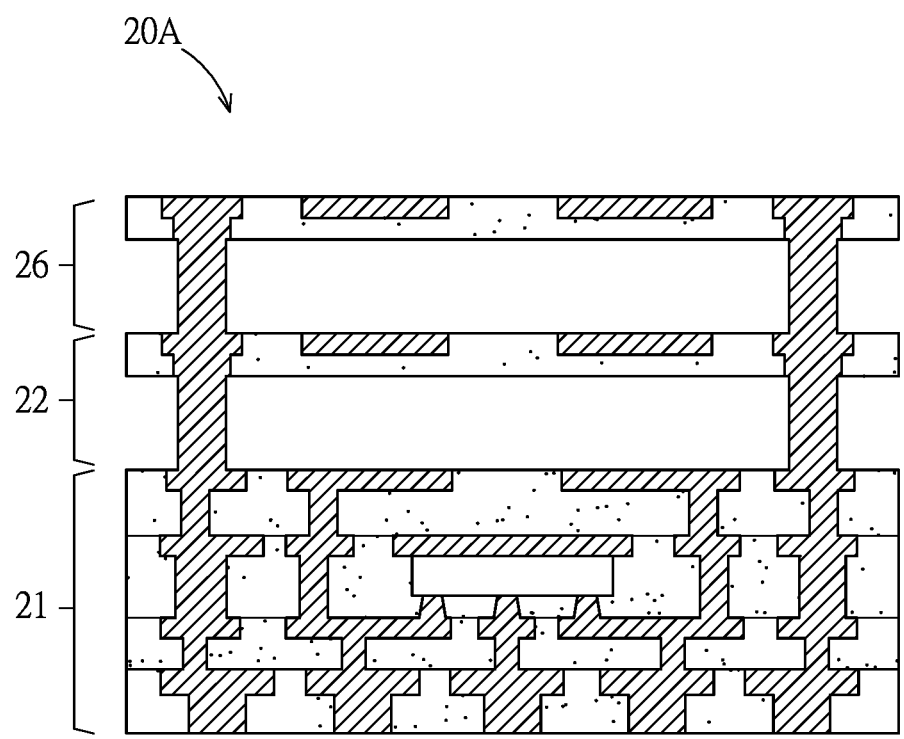
FIG. 8 is a schematic structural diagram showing the semiconductor package antenna structure according to the second embodiment of the present invention.

Next, please refer to FIG. 8. In the second embodiment of the invention, the semiconductor package antenna structure 20A may include an additional third substrate 26 disposed on top of the second substrate 22 of the original semiconductor package antenna structure 20 based on the requirements for antenna performance. The third substrate 26 may be formed using the two manufacturing methods described aforementioned, and further details are not provided here.

Finally, please refer to FIG. 9. In the third embodiment of the invention, the semiconductor package antenna structure 20B, with respect to the second substrate 22B, differs in that spaces between the conductive pillar 221a and conductive pillar 221b can be further divided by disposing of the conductive pillar 221c. This division allows for multi-band functionality and provides a more stable support structure. In other words, the second conductive pillar layer 221 may enclose one or more spaces of the air dielectric layer 223. In this embodiment, the spaces are shown as two on the cross-sectional view. In a three-dimensional view or in other embodiments, these spaces can be divided into more using fence-like structures or continuous wall structures of the conductive pillars, and the sizes of each space can be the same or different, with no limitations.

In summary, the semiconductor package antenna structure and its manufacturing methods disclosed in this invention provide the following advantages:
(1) The semiconductor package antenna structure embeds the chip directly into the packaging. This allows for the electrical connections of the chip to be made using semiconductor processes, using copper as electrical connections without the need for additional conductive bumps or solder balls. This simplifies the process, making packaging suitable for fine pitch I/O points and reducing the package thickness.
(2) Using the semiconductor build-up circuit process to integrate the metal chip holder into the redistribution layer and form it together can simplify the process. This integration, formed using semiconductor layering processes, can also prevent electromagnetic interference with the semiconductor chip, thus increasing antenna efficiency.
(3) The air dielectric layer is used as the dielectric material for antenna radiation in the semiconductor package antenna structure. Since the dielectric constant of air approaches "1", it can effectively increase the antenna bandwidth or reduce the package volume. In other words, it offers improved antenna performance within the same volume and thinner packaging with equivalent antenna performance.
(4) Connecting the chip through patterned metal layers, typically made of copper, offers significant reduction in thermal resistance compared to solder balls.
(5) The conductive pillars around the chip can be used to adjust the radiation pattern antenna, further enhancing antenna performance.
(6) Using the conductive pillars of the second conductive pillar layer in the second substrate as stiffeners eliminates the need for additional manufacturing steps, simplifying the process.

Even though numerous characteristics and advantages of certain inventive embodiments have been set out in the foregoing description, together with details of the structures and functions of the embodiments, the disclosure is illustrative only. Changes may be made in detail, especially in matters of arrangement of parts, within the principles of the present disclosure to the full extent indicated by the broad general meaning of the terms in which the appended claims are expressed.

What is claimed is:

1. A semiconductor package antenna structure, comprising:
   a first substrate, which has at least two stacked first redistribution layers, and each of the first redistribution layers has a first dielectric layer, a first patterned metal layer, and/or a first conductive pillar layer;
   a chip, which is embedded within the first substrate and is coupled to the first redistribution layers; and
   a second substrate, which is disposed opposite to the first substrate and has a second redistribution layer, a second conductive pillar layer, and an air dielectric layer, wherein the second conductive pillar layer protrudes on the second redistribution layer;
   wherein the second substrate is connected to the first substrate through the second conductive pillar layer, and the air dielectric layer is situated between the second redistribution layer, the second conductive pillar layer, and the first substrate and wherein an active surface of the chip faces away from the second substrate;
   wherein a part of the first redistribution layer, a part of the second redistribution layer, and a part of the second conductive pillar layer form a transmitting antenna, while another part of the first redistribution layer, another part of the second redistribution layer, and another part of the second conductive pillar layer form a receiving antenna.

2. The semiconductor package antenna structure of claim 1, wherein the first redistribution layer of the first substrate has a metal chip holder, which is in contact with the chip and is located between the chip and the second substrate.

3. The semiconductor package antenna structure of claim 1, wherein the part of the first conductive pillar layer and the part of the second conductive pillar layer are used to adjust the radiation field pattern of the antenna.

4. The semiconductor package antenna structure of claim 1 wherein the second conductive pillar layer is a fence-like type or a continuous wall type, and the second conductive pillar layer encloses one or more spaces of the air dielectric layer.

5. The semiconductor package antenna structure of claim 2, wherein the second conductive pillar layer is a fence-like type or a continuous wall type, and the second conductive pillar layer encloses one or more spaces of the air dielectric layer.

6. The semiconductor package antenna structure of claim 3, wherein the second conductive pillar layer is a fence-like type or a continuous wall type, and the second conductive pillar layer encloses one or more spaces of the air dielectric layer.

7. A manufacturing method for the semiconductor package antenna structure, comprising the following steps:
   forming a first substrate, which includes sequentially forming at least two layers of first redistribution layer, embedding a chip within these at least two layers of first redistribution layer during the process of forming at least two layers of the first redistribution layer, wherein an active surface of the chip is electrically coupled with one of the first redistribution layers;
   forming a second substrate, which includes forming a second redistribution layer and forming a second conductive pillar layer protruding from the second redistribution layer, wherein the active surface of the chip faces away from the second substrate; and bonding the first substrate with the second substrate, wherein the second conductive pillar layer is connected to the second substrate and an air dielectric layer is formed between the second redistribution layer, the second conductive pillar layer, and the first substrate;

wherein a part of the first redistribution layer, a part of the second redistribution layer, and a part of the second conductive pillar layer form a transmitting antenna, while another part of the first redistribution layer, another part of the second redistribution layer, and another part of the second conductive pillar layer form a receiving antenna.

8. The manufacturing method of claim 7, wherein the second conductive pillar layer of the second substrate is connected to the first redistribution layer of the second substrate through the solder-ball, the conductive bump, or conductive adhesive.

9. The manufacturing method of claim 7, wherein the step of forming at least two layers of first redistribution layer of the first substrate further comprising:

forming a second seed layer;

forming a photoresist layer with at least one second through hole on the second seed layer;

electroplating to form a first patterned metal layer and/or a first conductive pillar layer within the second through hole;

disposing the chip on the first patterned metal layer, wherein the active surface of the chip is coupled with another first redistribution layer;

removing the photoresist layer and the second seed layer; and forming a first dielectric layer to cover the first patterned metal layer and/or the first conductive pillar layer, and the chip.

10. A manufacturing method for the semiconductor package antenna structure, comprising:

forming a first substrate, which includes sequentially forming at least two layers of first redistribution layer, embedding a chip within these at least two layers of first redistribution layer during the process of forming at least two layers of the first redistribution layer, wherein an active surface of the chip faces away from the second substrate, and it is electrically coupled with one of the first redistribution layers;

forming a second substrate on the first substrate that comprises:

forming a first seed layer on the first substrate;

forming a photoresist layer, which has at least one first through hole, on the first seed layer;

electroplating to form a second conductive pillar layer in the first through hole;

forming a second redistribution layer to connect to the second conductive pillar layer; and removing the photoresist layer to form an air dielectric layer between the second redistribution layer, the second conductive pillar layer, and the first substrate; and wherein the active surface of the chip faces away from the second substrate;

wherein a part of the first redistribution layer, a part of the second redistribution layer, and a part of the second conductive pillar layer form a transmitting antenna, while another part of the first redistribution layer, another part of the second redistribution layer, and another part of the second conductive pillar layer form a receiving antenna.

11. The manufacturing method of claim 10, wherein the step of forming at least two layers of first redistribution layer of the first substrate further comprising:

forming a second seed layer;

forming a photoresist layer with at least one second through hole on the second seed layer;

electroplating to form a first patterned metal layer and/or a first conductive pillar layer within the second through hole;

disposing the chip on the first patterned metal layer, wherein the active surface of the chip is coupled with another first redistribution layer;

removing the photoresist layer and the second seed layer; and forming a first dielectric layer to cover the first patterned metal layer and/or the first conductive pillar layer, and the chip.

* * * * *